United States Patent [19]
Svensson et al.

[11] Patent Number: 5,585,796
[45] Date of Patent: Dec. 17, 1996

[54] ANALOG-TO-DIGITAL CONVERTING ARRANGEMENT

[76] Inventors: Christer M. Svensson, Anders väg 33, S-590 00 Ljungsbro, Sweden; Jiren Yuan, Ryds allé 22B, S-582 48 Linköping, Sweden

[21] Appl. No.: 256,976
[22] PCT Filed: Jan. 29, 1993
[86] PCT No.: PCT/SE93/00065
  § 371 Date: Sep. 19, 1994
  § 102(e) Date: Sep. 19, 1994
[87] PCT Pub. No.: WO93/15556
  PCT Pub. Date: Aug. 5, 1993

[30] Foreign Application Priority Data

Jan. 31, 1992 [SE] Sweden ................................ 9200275
Oct. 12, 1992 [SE] Sweden ................................ 9202994

[51] Int. Cl.$^6$ ................................................ H03M 1/12
[52] U.S. Cl. ............................................................ 341/155
[58] Field of Search ................................ 341/155, 163, 341/164, 165, 161, 159

[56] References Cited

U.S. PATENT DOCUMENTS 4,633,226  12/1986  Black ........................................ 341/159
4,763,106   8/1988  Gulczynski .
5,272,481  12/1993  Saver ........................................ 341/165

FOREIGN PATENT DOCUMENTS 60-29028   2/1985  Japan .
60-43922   3/1985  Japan .
2175762   12/1986  United Kingdom .

Primary Examiner—Brian K. Young
Attorney, Agent, or Firm—Young & Thompson

[57] ABSTRACT

An analog-to-digital arrangement for A/D converting a high-frequency analog input signal into a series of digital signals on-line with high sampling rate. It includes several computing channels for providing a digital signal from an analog input, each including a sample-and-hold means, to which the analog input signal is connected, a multiplexing means having several inputs, each input being connected to an individual computing channel output, and, a timing circuit controlling cyclically in a clock signal rate and in a prescribed order one at the time of the sample-and-hold means to hold the current analog value of the analog input signal and also to control the multiplexing means to place on its output one at the time of the digital outputs of the several computing channels. All the computing channels compute the digital value of the analog value held in its sample-and-hold means during a digitizing phase simultaneously but skewed in relation to the other computing channels.

8 Claims, 4 Drawing Sheets

ANALOG-TO-DIGITAL CONVERTING ARRANGEMENT

BACKGROUND OF THE INVENTION

1. Field of the Invention

The invention relates particularly to a video-frequency analog-to-digital converting arrangement (ADC) having a high sampling rate and low power consumption.

2. Discussion of the Related Art

In digitizing analog signals, an ADC is essential. In video and any real-time digital signal processing, high sampling rate is required and, in most cases, low power consumption is important.

So far, among many fast ADC architectures, the highest sampling rate is obtained by well-known flash ADC in which $2^n$ comparators are needed, n being the bit number. The sampling time of a flash ADC depends on the preparation and comparison time needed by each comparator.

An improvement in reducing the number of comparators is realized by using the well-known half-flash ADC (two-step or subranging ADC), in which the digitizing is finished in two steps, a coarse step performed by $2^{n/2}$ comparators, and a fine step performed by another $2^{n/2}$ comparators. For a half-flash ADC the number of comparators needed is $2^{(1+n/2)}$, and the sampling time equals at least twice as much as that of a flash ADC. For further reduction of the number of comparators in a half-flash comparator, the coarse and fine comparators may be merged, as described in the article "A 10-bit 5-Msample/s CMOS two-step flash ADC" by Joey Doernberg, Paul R. Gray, and David A. Hodges, IEEE Journal of Solid-State Circuits, vol. 24, pp. 241–249, April 1989. In order to reduce the sampling time of a half-flash ADC to that of a flash ADC, the coarse and fine comparisons can be pipelined, as described in the article "An 8-bit 50-MHz CMOS subranging A/D converter with pipelined wide-band S/H" by Masayuki Ishikawa and Tsuneo Tsukahara, IEEE Journal of Solid-state Circuits, vol. 24, pp. 1485–1491, December 1989.

Among other choices, an ADC having pipelined coarse and fine comparisons can reduce the comparator number to n, if one-bit stages are cascaded, as described in the article "An algorithmic analog-to-digital converter" by R. H. McCharles, V. A. Saletore, W. C. Black, Jr., and D. A. Hodges, IEEE Int. Solid-State Circuits conf. Digest of Tech. Papers, pp. 96–97, Feb. 1977. However, the sampling time of such an ADC is more than the preparation and comparison time needed by each comparator and, because of accumulated error during multiple algorithmic operations, it is difficult to reach high precision.

Instead of one-bit stages, three-bit stages can be cascaded in order to limit the length of the pipeline and to obtain extra correcting bits, as described in the article "A pipelined 5 MHz 9b ADC" by Stphephen H. Lewis, Paul R. Gray, 1987 IEEE Int. Solid-state circuits conf. Diges of Tech. Papers, pp. 210–211, Feb. 1987. However, this will nullify the advantage of such a pipelined ADC.

CMOS is the preferred technology particularly for low power consumption. An auto-zero phase is inevitable for a CMOS comparator when providing an 8-bit resolution or higher. The preparation time mentioned above for each CMOS comparator is quite long. It can be at least twice as long as its comparison time. Therefore, the sampling time of all CMOS ADCs listed above are dominated by the auto-zero phase. One technique, called cyclic auto-zero, for overcoming this problem has been proposed in the article "A 0.8 watts, 10 bits/20 MHz CMOS flash converter based on an original technic called cyclic auro-zero" by Thierry Masson, Proceedings of ESSCIRC'90, pp 121–124, September 1992. Unfortunately, it can only be used in a flash ADC consuming a lot of power.

In order to have high sampling rate and low power consumption, therefore, one way is to develop a better process having a smaller feature size. However, the expenses for such a process is high and there is always a limit to the feature size.

OBJECTS AND SUMMARY OF THE INVENTION

An object of the invention is to provide a high performance ADC which offers a good precision, a high sampling rate and a low power consumption in a cost-effective way compared with existing analog-to-digital computing arrangements.

Another object is to provide an architecture which is flexible in the trade-off between speed, power and hardware.

Still another object is to provide an architecture in which the addition of coarse and fine reference voltages gives rise to a negligible reduction of the effective differential voltage to the comparator.

An earlier approach to solve the problem of producing stair-chases of coarse and fine reference voltages for the conversion purposes is presented in the article "An 8-bit two-step flash A/D converter for video applications", by A. Cremonesi, F. Maloberti, G. Torelli, and C. Vacci, IEEE 1989 Custom Integrated Circuit Conference, pp 6.3.1 to 6.3.4. In the circuit described in this article a summation circuit includes two capacitors, which have the same capacity, which causes the effective input differential voltage to be reduced by 50%. In the present invention capacitors of different capacity is used, whereby the reduction of the effective input differential voltage is negligible.

The UK Patent Application No. 2175762 describes a system, in which several analog-to-digital converters make their converting parallelly but displaced to each other. However, the A/D converting is made using so called "dual slope" or is of a kind in which the analog signal is integrated.

The main object of the invention is achieved with an arrangement of the kind set forth below. Further features and further developments of the invented arrangement will be revealed in the description below.

According to the invention an arrangement is provided for converting a high-frequency analog input signal into a series of digital signals on-line with high sampling rate, including:

a. several computing channels (1.1 to 1.k+n;SA-ADC) for providing a digital signal from an analog input;

b. a multiplexing means (3) having several inputs, each input being connected to an individual computing channel output;

c. a timing circuit (4) controlling cyclically in a clock signal rate and in a prescribed order one at the time of the computing channels to receive the current analog value of the analog input signal and also to control the multiplexing means (3) to place on its output one at the time of the digital outputs of the several computing channels;

d. all the computing channels being adapted to compute the digital value of its received analog value during a digitizing phase simultaneously but skewed in relation to the other computing channels.

e) each computing channel (1.1 to 1.k+n;SA-ADC) includes a sample-and-hold means (5), to which the analog input signal is connected and at least one successive approximating analog-to-digital converter (SA-ADC);

f. a common reference voltage generator (2) is provided having a multiline output having a different reference voltage on each line of the multiline output; and g. all the computing channels have at least one multiline input connected in common to the multiline output of the voltage generator.

The successive approximation could preferably be made in a coarse and a fine approximation phase and then, if two capacitors are provided, each having one electrode connected to a comparator means, the capacitor connected to the output of the coarse switch group having a substantially larger capacitance than the capacitor connected to the output of the fine switch group, then the reduction of the input differential voltage is negligible. The large effective differential input voltage reduces the impact of comparator offset, and the large fine reference voltage reduces the impact of noise and improves the precision.

BRIEF DESCRIPTION OF THE DRAWINGS

For a more complete understanding of the present invention and for further objects and advantages thereof, reference is now made to the following description taken in conjunction with the accompanying drawings, in which.

The same references are used for elements having the same functional task in the Figures.

DESCRIPTION OF THE PREFERRED EMBODIMENT

Figure 1:
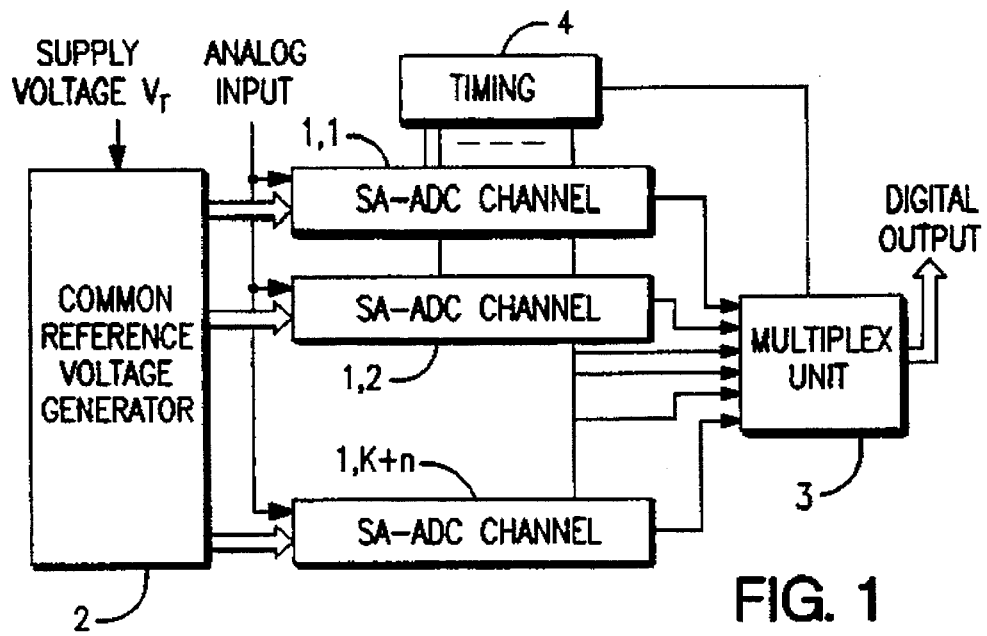
FIG. 1 is a schematic block diagram of the arrangement according to the invention.

Referring to FIG. 1, an embodiment of a particular architecture and implementation is schematically shown. According to the invention sucessive approximation analog-to-digital conversion is provided in several channels which makes the conversion simultaneously, i.e. in parallel, but skewed to each other. Thus the parallel successive approximation analog-to-digital converter, below called PSA-ADC, includes a number of identical successive approximation analog-to-digital converter channels 1.1 to 1.k+n, below called SA-ADC channels, provided in parallel. Each SA-ADC channel 1.1 to 1.k+n has a signal input, a multiline reference input, and an output. An analog input is fed in common to the signal input of all SA-ADC channels.

A common reference voltage generator 2 feeds reference voltages in predetermined steps in common to the reference input of all SA-ADC channels 1.1 to 1.k+n. A supply voltage Vr is fed to the reference voltage generator 2 and sets the maximum voltage to be divided into the voltage steps.

A multiplexing unit 3 having the same number of multiline inputs as the number of SA-ADC channels 1.1 to 1.k+n has each of its multiline inputs connected one at the time to the multiline output through time multiplexing. The outputs of a separate SA-ADC channel among the SA-ADC channels is controlled by the clock to make a multiplexing of its inputs. The outputs of the parallel channels is presented on the digital output in series after each other on the digital output of the unit 3 and could then be stored temporarily or permanently in some kind of register (not shown) or be used on-line.

A timing circuit 4 provides clock signals to the SA-DAC channels 1.1 to 1.k+n and to the multiplexing unit 3. It also provides an individual timing signal to each of the SA-ADC channels 1.1 to 1.k+n so that only one of them at a time temporarily stores the momentary signal to the analog input.

Figure 2:
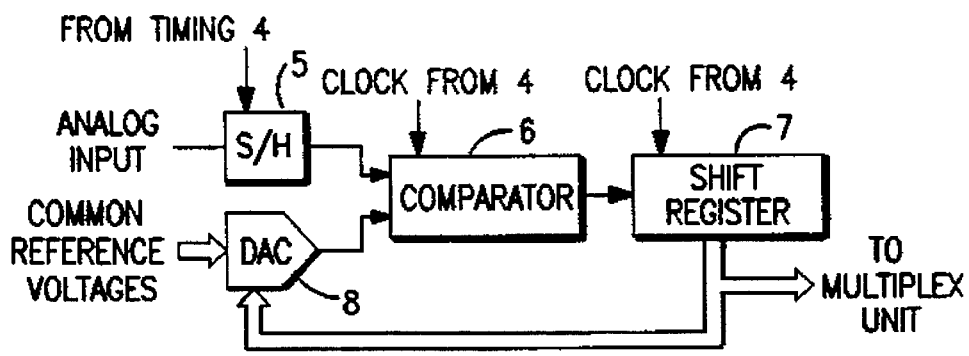
FIG. 2 is a block diagram of a first embodiment of a successive approximation analog-to-digital converter channel included in the invention.

As shown in the first embodiment of an SA-ADC in FIG. 2, each SA-ADC channel includes its sample-and-hold circuit 5, to which the analog input is fed to it signal input. A control signal from the timing circuit 4 (FIG. 1) controls the circuit 5 to take the value on the signal input and to hold it until it receives a new control signal from the circuit 4. The output of the sample-and-hold circuit 5 is fed to one of two inputs of at least one successive approximation analog-to-digital converter (only one is shown in FIG. 2), including an auto-zeroed comparator 6, the output of which is fed to a shift register 7, and a digital-to-analog converter 8, below called DAC.

The digital multiline output of the shift register 7 is connected to the multiplexing unit 3 (FIG. 1) and also to a digital multiline input of the DAC having reference inputs connected to the reference voltage outputs of the generator 2 (FIG. 1). The output of the DAC is connected to the second input of the comparator 6. The computing of a digital value corresponding to the analog value on the first comparator is performed as follows. Initially, the DAC chooses the center reference value and a comparison is performed. If the analog value exceeds the value of the DAC output, the comparator output is "1" or else it is "0" which value is placed in the shift register and corresponds to the most significant bit of the searched digital value. Next, this value controls the next output from the DAC, so that its output equals the reference value in the center of the remaining window, below or above the first DAC output, the second motst significant bit, which is placed in the shift register. This process is continued until all the n desired bits are generated and placed in the shift register.

The common reference voltage generator 2 together with the auto-zeroed comparator 6 ensures the precision of the PSA-ADC. The multiplexing unit 3 collects digitized data from each SA-ADC channel 1.1 to 1.k+n and pipelines them to its output, i.e. it feeds the digitized data from the SA-ADC channels one at the time to its output controlled by the clock signal from the timing circuit 4.

Figure 3:
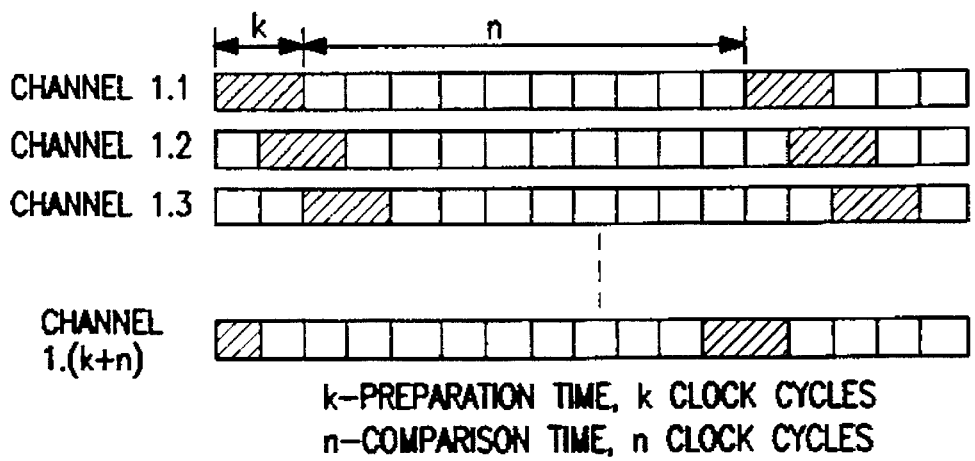
FIG. 3 is a timing diagram for the outputs of the parallelly but skewed processing converter channels.

The timing diagram for the outputs of the parallel SA-ADC channels 1 with mutually skewed processing is shown in FIG. 3. Each channel is successively skewed by one clock cycle from the next previous in the succession. There is a preparation time of k clock cycles, where k is an integer, which in FIG. 3 is illustrated to be 2, in the beginning of each operation cycle of each channel for auto-zeroing purposes. The comparison time is n clock cycles, where n is an integer. The output data of a SA-ADC is not valid during its preparation time but valid during its comparison time. Since each channel needs (k+n) clock cycles to finish both the auto-zero and the binary search procedure, and (k+n) channels are provided, the PSA-ADC in FIG. 1 refreshes digitized data each clock cycle. Each clock cycle provides one bit of information from n of the (k+n) SA-ADC channels being provided in parallel as the digital inputs to the multiplexing unit.

Figure 4:
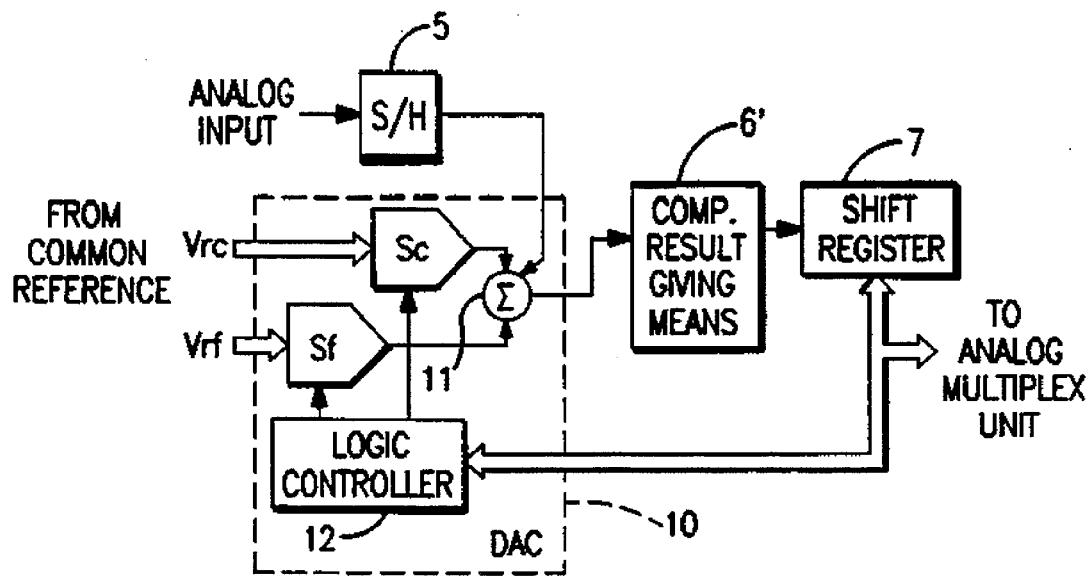
FIG. 4 is a block diagram of a second embodiment of a successive approximation analog-to-digital converter channel included in the invention.

FIG. 4 shows a second embodiment of a SA-ADC channel 1.1 to 1.k+n in FIG. 1. The reference voltage generator common for all the SA-DAC channels does in this embodiment produce two groups of reference voltages, one coarse output group Vrc and one fine output group Vrf. Each group includes $2^{n/2}$ reference voltages. The DAC 10 in the embodiment in FIG. 4 has two multiline inputs, each connected to a separate of the two output groups from the generator. The DAC 10 works in two steps. It includes two groups of switches Sc and Sf, respectively, each group having $2^{n/2}$ switches. The first group Sc is connected to the coarse output group Vrc, the second group Sc to the fine output group Vrf.

The outputs of the switch groups Sc and Sf are connected to two inputs for analog values of a summation circuit 11, which can give a complete reference including $2^n$ voltages by adding the two groups of $2^{n/2}$ voltages. The result of the output of the summation circuit 11 and the output of the sample-and-hold circuit 5 are compared in the comparator 6, and the output of the comparator is fed to the shift register 7.

It is to be noted that the comparator 6 could be a part of the summation circuit 11 such that the circuit 11 makes a summation of the outputs from the first and second groups Sc and Sf and substract the output from the sample-and-hold circuit 5. The "comparator" 6 then only provides an output indicating with a "0" that the value from the summation circuit is different from 0 V and with a "1" that the value is 0 V and with a "1" that the value is larger than 0 V.

The switches in the two switch groups Sc and Sf are controlled by a logic controller 12 using the comparison result from the shift register 7 of each bit during the successive binary search. The shift register 7 stores each resulting bit and provides them to both the logic controller 12 in the DAC 10 and to the multiplexing unit 3 (FIG. 1).

Figure 5:
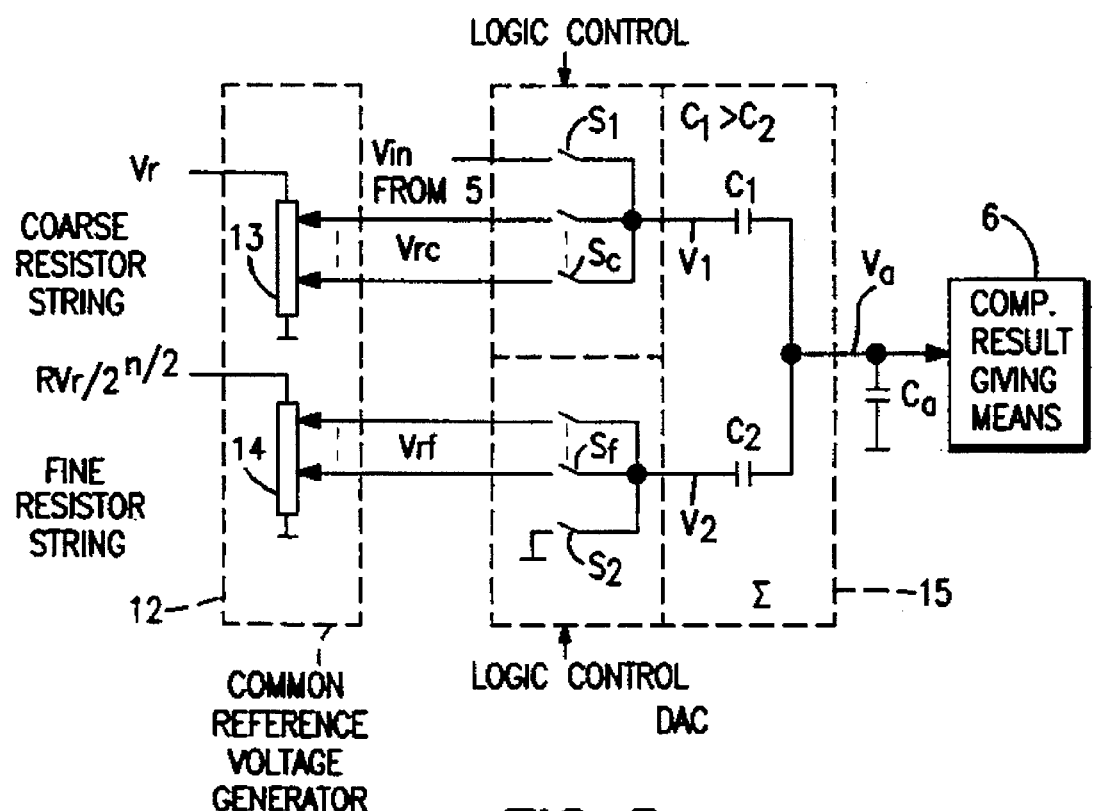
FIG. 5 is a circuit diagram of an embodiment of a digital-to-analog converter included in the converter channel shown in FIG. 4.

FIG. 5 shows an embodiment of the DAC 10 in the embodiment of the SA-ADC channel shown in FIG. 4. The common reference voltage generator 12 includes a coarse resistor string 13 and a fine resistor string 14. One end of each resistor string is connected to ground. The reference voltage of the coarse reference string 13 is Vr. The reference voltage of the fine reference string 14 is $R*Vr/2^{n/2}$ where R is an integer larger than 1.

The two resistor strings 13 and 14 may be merged in practice. The coarse resistor string 13 produces a staircase of output voltages Vrcp=$p*Vr/2^{n/2}$ where p is an integer from 0 to $2^{n/2}$ The fine resistor string 14 produces a staircase of output voltages Vrfq=$q*R,Vr/2$, where q is an integer from 0 to $2^{n/2}$ The logic controller 15 closes an appropriate one of the normally open switches in the switch group Sc and an appropriate one of the normally open switches in the switch group Sf, dependent upon the feedback digital signal from the shift register 7 (not shown in FIG. 5). A first zeroing switch s1 is connected between the input voltage source Vin from the sample-and-hold circuit 5 (see FIG. 2) and the output of the coarse switch group Sc. A second zeroing switch s2 is connected between ground and the output of the fine switch group Sf.

The summation circuit 15, using the principle of charge redistribution, is simply provided by two capacitors, C1 between the output of the switch group Sc and the input of the comparating result giving means 6' and C2 between the output of the switch group Sf and the input of the means 6'. C1/C2=R, which means that C1 is larger than C2.

The operation cycle of a DA-ADC channel is such:

1. During the auto-zero phase, the zeroing switches S1 and S2 are closed and all the switches in the switch groups Sc and Sf are open, and hence the output voltage V1 of the switch group Sc becomes V1=Vin (analog input from the sample-and-hold circuit 5, see FIG. 2) and the output voltage V2 of the switch group Sf becomes V2=0. The input voltage Va of the comparator 6 is the auto-zero voltage. It can be derived that the effective differential input voltage ΔVa to the comparating result giving means 6' is ΔVa=(ΔV1*C1+ΔV2*C2)/(Ca+C1+C2), where Ca is the sum of the comparator input capacitance and parasitic capacitances.

2. During the coarse search phase, the center switch in the switch group Sc is closed, and ΔV1=Vrc-Vin and ΔV2=0. The logic controller 12 (FIG. 4) works such that ΔVa always approaches zero. The coarse search, closing the switches in the switch group Sc one by one, produces n/2 high-bits provided successively in the shift register 7.

3. During the final fine search phase, the center switch in the switch group Sc is closed, and ΔV1=Vmsb-Vin, where Vmsb is a Vrcp closest to Vin but lower than Vin, and ΔV2=Vrf. The fine search, closing the switches in the switch group Sf one by one, produces n/2 low-bits provided successively in the shift register 7.

Since both Vin and Vrc are fed through the same capacitor C1 there will be no reference error during the coarse search. However, during the fine search, Vrf is fed through C2. If C1/C2=R*(1+a), and a#0, there will be a reference error ΔVr=a*Vrf/R=a*p*Vr/$2^n$ In the worst case p=$2^{n/2}$, ΔVr= a*Vr/$2^{n/2}$. If ΔVr<0.5*Vlsb, Vlsb being the voltage for the least significant bit, Vlsb=Vr/$2^n$ is required, a should be less than $2^{-(1-n/2)}$. For example, a 10-bit ADC demands a <1.5%. This is well above the limitation of capacitor ratio error in a CMOS process.

Figure 6:
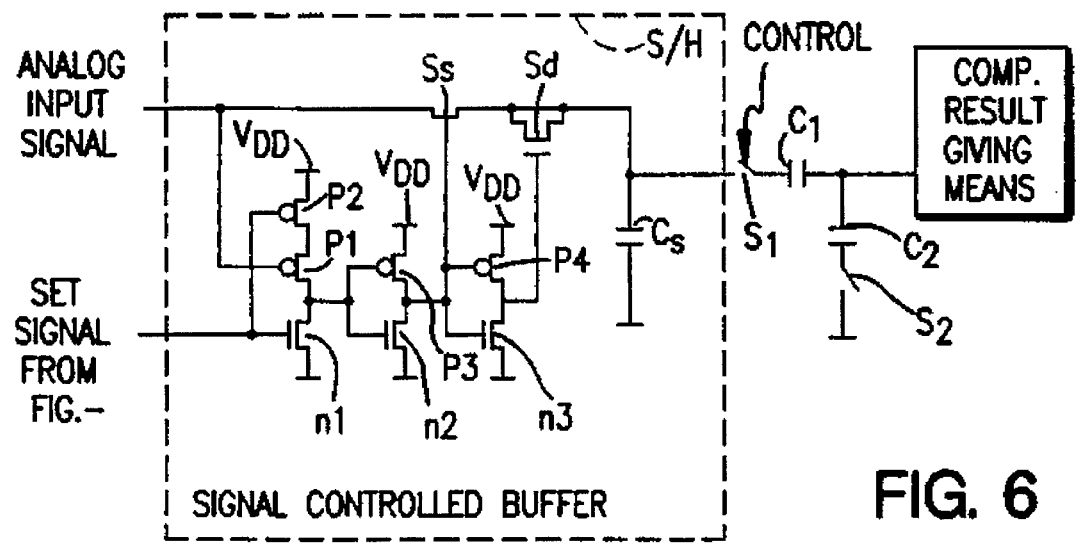
FIG. 6 is a circuit diagram for an embodiment of a sample-and-hold circuit included in the arrangement according to the invention.

FIG. 6 shows an embodiment of a sample-and-hold circuit S/H, which can be used as the sample-and-hold circuit 5 in the embodiments of the SA-ADC shown in FIGS. 2 and 4. It includes a switch n-channel MOS-FET Ss, which normally is in a non-conducting mode. Its drain electrode is connected to the source of analog input signal, its drain is, via a dummy switch n-channel MOS-FET Sd to absorb the charge feedthrough of the switch MOS-FET Ss, connected to the output of the sample-and-hold circuit S/H to capacitor Cs. The gate electrodes of both the switch MOS-FETs Ss and Sd are controlled to their conducting mode by a signal-controlled set buffer circuit, to which the set signal from the timing circuit 4 is fed, when the SA-ADC including the sample-and-hold circuit S/H in question is in turn to be set, i.e. be provided with the analog voltage to be handled by it.

The signal-controlled set buffer includes a first inverter including the MOSFETs n1,p1,p2, a second inverter including the MOSFETS n2,p3, and a third inverter including the MOSFETs n3,p4. The analog input signal is connected to the gate of the MOSFET p1 in the first inverter, thereby controlling the signal delay of that inverter. The second inverter is conditioning the gate signal to Ss and the third inverter generates the gate signal for the dummy n-channel MOSFET Sd.

Since in the PSA-ADC according to the invention only one channel at the time is controlled to hold the analog input, the input capacitance of the sample-and-hold circuit shown in FIG. 6 is quite small and is comparable of that to a buffer. This offers a possibility to omit such an input buffer that is usually used. This avoids the offset caused by such a buffer.

In the second embodiment of a SA-ADC channel shown in FIG. 4 the output of the sample-and-hold circuit S/H is connected to one of multiple inputs of the summation circuit 11, i.e. connected to one end of the switch s1 of the embodiment of the DAC shown in FIG. 5. The elements Ss, C1, C2 and S2 of the DAC in FIG. 5 are also shown in FIG. 6.

1. During times when setting is not to be performed, the control signals generated by the logic controller 15 to the switches Ss, S1, and S2 are such that the switches Ss, S1, and S2 are open.
2. When the sample value is to be set all the switches are closed. The sampling time constant is mainly defined by the resistance of the switch MOS-FET Ss, the output resistance of the signal source and the sampling capacitor Cs.
3. During the setting, capacitors Cs, C1 and C2 are fully charged.
4. After the setting the switch Ss open simultaneously. However, the switches S1 and S2 must not open until the comparator is fully auto-zeroed.

The dummy switch Sd is used to absorb the charge feedthrough of the switch MOS-FET Ss. The modulation effect of the signal level on the sample position through the set signal slope is overcome by the signal controlled set buffer n1 to n3 and p1 to p4, which works such that the higher the signal level is the more set signal delay.

Figure 7:
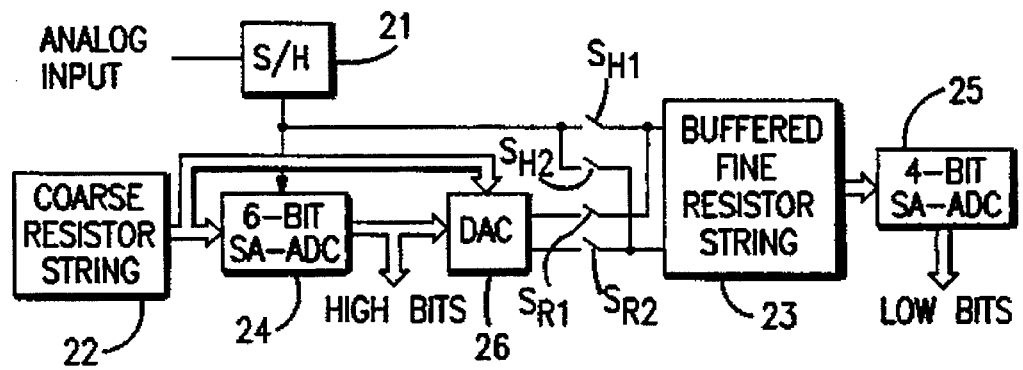
FIG. 7 is a block diagram of a third embodiment of successive approximation analog-to-digital converter channel included in the arrangement according to the invention.

FIG. 7 shows a schematic diagram of a third embodiment of one channel of the PSA-ADC according to the invention. In this embodiment each channel includes two SA-ADC 24 and 25, one coarse and one fine SA-ADC, in principle. The PSA-ADC including channels of the kind shown in FIG. 7 may have eight identical channels of the illustrated type skewed by one set cycle and, therefore, producing digital data each set cycle. It will be described according to a 10-bit resolution.

The analog input is connected to a sample-and-hold circuit 21, which may have the same configuration as the one shown in FIG. 6. The common reference voltage generator including a coarse resistor string 22 only produces coarse reference voltages. The essential in this embodiment is that the fine reference voltages are produced by a buffered resistor string 23 in each SA-ADC channel. Thereby, the linearity requirement for the fine string is reduced by a factor $2^m$, where m is the coarse bit number.

Figure 8:
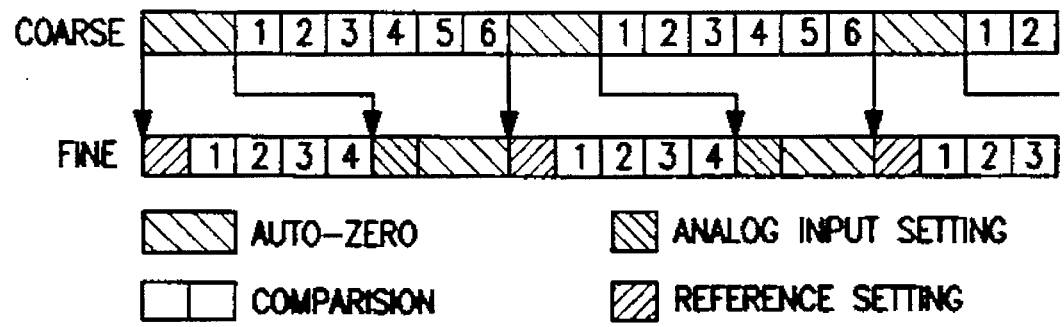
FIG. 8 is a timing diagram for the outputs of the parallelly but skewed processing converter channels having coarse and fine successive approximation.

The input and the reference voltages are buffered by buffers having the same configuration, and this means that the offset and the gain errors are cancelled in principle. The coarse SA-ADC 24 could for instance cover six bits, while the fine SA-ADC 25 could for instance cover only four bits, in order to further limit the buffer error. The timing in one channel having this design is shown in FIG. 8, which is believed to be self explanatory.

The digital output of the six-bit SA-ADC 24 which represents the six most significant bits is connected to a digital-to-analog converter 26, below called DAC, which uses the same reference voltages from the resistor string as the SA-ADC, and to the multiplexing unit. The DAC 26 is realized by a switch network, in the way common in the art, connected to the common reference voltages, which network is controlled by the result of the coarse SA-ADC 24. It has two outputs, so it provides two consecutive of sixtythree possible reference voltages, thus constituting a reference voltage range. The DAC 26 and the sample-and-hold circuit 21 are connected to the buffered fine resistor string 23 through a switch network having two controlled switches SH1 and SH2 connected from the output of the circuit 21 to each one of two inputs of the resistor string 23 and two controlled switches SR1 and SR2 connected from the two outputs of the DAC 26 to each one of the two inputs of the resistor string 23. The fine and the coarse reference voltages are matched because the fine resistor string 23 is placed to provide the fine reference voltage range defined by the two coarse reference voltages of interest for the actual sampling. The analog output of the resistor string 23 is fed to the four-bit SA-ADC 25, which provides a digital output having the least significant bits of the sampled value.

Figure 9:
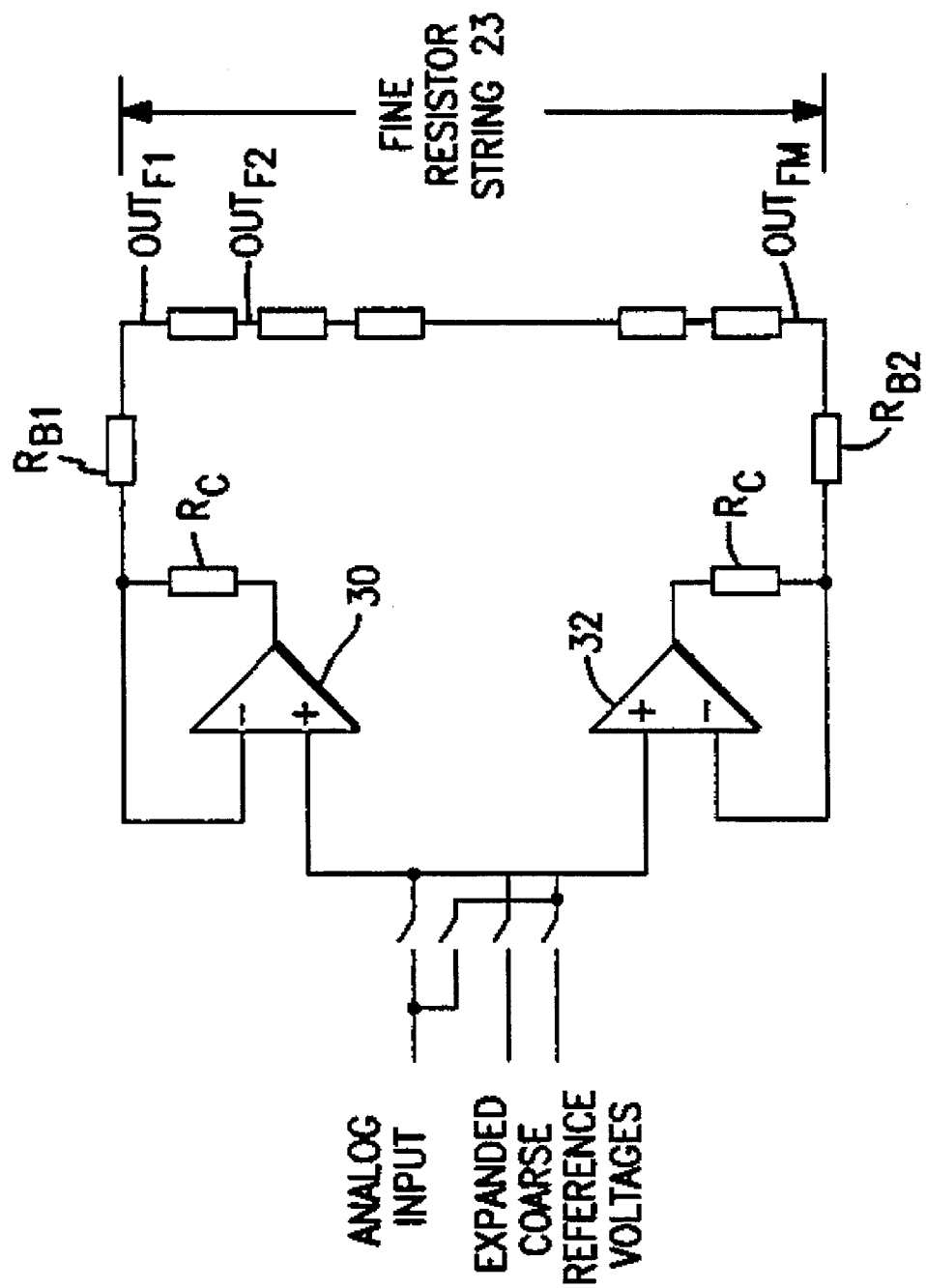
FIG. 9 is a circuit diagram of an embodiment of a buffered fine resistor string.

The embodiment of the buffered fine resistor string in the channel shown in FIG. 9 includes one buffer circuit 30 and 32, respectively, on each input. Each buffer circuit is an operational amplifier having its (+)-input fed with the input voltage and its output is connected to the (−)-input through a feedback resistor Rc. The buffer circuits 30 and 32 copy both the analog input from the sample-and-hold circuit 21 and from the DAC 26 to be provided across the fine resistor string 23 via a resistor RB1 and RB2, respectively, connected between the (−)-input of the buffer 30 or 32 in question and one end of the fine resistor string 23. Each buffer has an inherent cancellation of both offset and gain error.

However, there are two factors that produce errors. Firstly, the offsets caused by the unsymmetry of two buffers are different at different output positions $OUT^{F1}$ to $OUT^{FM}$ of the fine string 23. During the auto-zero phase, the comparator (not shown in FIG. 9) is connected to the middle tap of the fine string. Then, during the comparison time, the comparator will be connected to one by one of the other taps during the binary search. Therefore, the offset differences are added to the comparator. Secondly, the output voltages of the buffers 30, 32 will drop during the search because of the resistive load.

The first kind of error is alleviated by using an expanded coarse reference range. The correct coarse reference range can still be obtained by adding the two extra resistors $R_{B1}$ and $R_{B2}$. The second kind of error can be eliminated by using a compensated feedback by using a compensation resistor $R_C$. The voltage drop across $R_C$ gives a compensated feedback and the output drop becomes negligible.

The following advantages are achieved with the PSA-ADC according to the invention:

1. High performance

High sampling rate and low power consumption are achieved by the PSA-ADC architecture. The advantages are valid if the circuit is built in either CMOS or bipolar technologies or in any other electronic circuit technology. A PSA-ADC is particularly effective using CMOS technology, since the comparator needs an auto-zero phase. A high resolution is achieved by a long auto-zero phase with very small speed degradation, which is impossible for any other kinds of ADCs. For example, for a case when the auto-zero phase for a ten-bits PSA-ADC according to the invention needs a comparison time twice as long as the comparison time, the sampling rate for the PSA-ADC according to the invention is larger by a factor of three while the number of comparators is smaller by a factor of five, compared to a 10 bits half-flash ADC.

2. Flexibility

The speed of a PSA-ADC according to the invention can be altered by adjusting the skew between channels, denoted by the number of clock cycles. A skew of more than one clock cycle, resulting in less channels, can be used in order to have a limited power consumption. A skew of less than one clock cycle, for instance half a clock cycle, leading to more channels, can be considered in order to increase the speed. The PSA-ADC is quite flexible in the trade-off between speed and hardware.

3. Small area and low cost

The silicon area needed for providing an integrated circuit of the PSA-ADC according to the invention is apparently small. This is the result not only from using a small number of comparators but also because no digital encoder is included. The codes are produced directly by the binary search. The hardware volume of a PSA-ADC according to the invention is linearly proportional to the bit number instead of being exponentially as in most conventional analog-to-digital converting devices for video signals. All these features lead to a low cost. When a large number of A/D channels are required, several PSA-ADCs according to the invention can be integrated into a single chip, and this reduces the cost further.

The invention as claimed and defined by the claims is not limited to the specific embodiments illustrated in the drawings and described above. For instance the two-step SA-ADC may also be realized by a combination of a common coarse reference generator and a binary-weighted capacitor array generating fine references in each channel. It is also possible to have the reference voltages divided in more than two parts in order to have several staircases of reference voltages with mutually different resolutions.

As illustrated in the timing schedule for each channel shown in FIG. 8, the coarse and the fine SA-ADCs according to FIG. 7 are pipelined. Each of them need eight clock cycles. Either the six-bit SA-ADC or the four-bit SA-ADC include only one comparator.

We claim:

1. An arrangement for converting a high-frequency analog input signal into a series of digital signals on-line with high sampling rate, including:

a. several computing channels (1.1 to 1.k+n;SA-ADC) for providing a digital signal from an analog input;

b. a multiplexing means (3) having several inputs, each input being connected to an individual computing channel output;

c. a timing circuit (4) controlling cyclically in a clock signal rate and in a prescribed order one at the time of the computing channels to receive the current analog value of the analog input signal and also to control the multiplexing means (3) to place on its output one at the time of the digital outputs of the several computing channels;

d. all the computing channels comprising means for computing the digital value of its received analog value during a digitizing phase simultaneously but skewed in relation to the other computing channels; wherein e. each of said several computing channels (1.1 to 1.k+n;SA-ADC) includes a sample-and-hold means (5), to which the analog input signal and at least one successive approximating analog-to-digital converter (SA-ADC) is connected, and each computing channel is adapted to have an auto-zeroing phase for auto-zero its comparator means before the beginning of the digitizing phase; and wherein the number of computing channels corresponds to the number of clock signals needed for completing a period of an auto-zeroing phase and a digitizing phase in each one of the computing channels;

f. a common reference voltage generator (2) is provided having a multiline output having a different reference voltage on each line of the multiline output; and g. all the computing channels having at least one multiline input connected in common to the multiline output of the voltage generator.

2. An arrangement according to claim 1, characterized in that each successive approximating analog-to-digital converter (SA-ADC) includes a digital-to-analog converter means (8;10) having two multiline inputs, of which one is connected to the multiline output of the voltage generator, a compararing means to compare the outputs of the sample-and-hold circuit and from the digital-to-analog converter and a shift register having a multiline digital output connected to the second multiline input of the digital-to-analog converter means and to the multiplexing means.

3. An arrangement according to claim 2, wherein the common reference voltage generator produces coarse reference voltages connected in common to all the channels; and wherein the digital-to-analog converting means in each computing channel includes a coarse switch group switching the coarse reference voltages, a fine switch group switching the fine reference voltages, a summation circuit to add the coarse and the fine reference voltages together and a logic controller to control the switches; and wherein the fine resistor string in each channel is buffered and copies the sampled analog input to the analog-to-digital converting means for fine resolution during a coarse comparison phase and the resulting coarse voltage range to generate fine reference voltages needed during a fine comparison phase.

4. An arrangement according to claim 1, wherein said arrangement it is provided in an integrated circuit chip.

5. An arrangement for converting a high-frequency analog input signal into a series of digital signals on-line with high sampling rate, including:

a. several computing channels (1.1 to 1.k+n;SA-ADC) for providing a digital signal from an analog input;

b. a multiplexing means (3) having several inputs, each input being connected to an individual computing channel output;

c. a timing circuit (4) controlling cyclically in a clock signal rate and in a prescribed order one at the time of the computing channels to receive the current analog value of the analog input signal and also to control the multiplexing means (3) to place on its output one at the time of the digital outputs of the several computing channels;

d. all the computing channels comprising means for computing the digital value of its received analog value during a digitizing phase simultaneously but skewed in relation to the other computing channels; wherein e. each of said several computing channels (1.1 to 1.k+n;SA-ADC) includes a sample-and-hold means (5), to which the analog input signal and at least one successive approximating analog-to-digital converter (SA-ADC) is connected, and each successive approximating analog-to-digital converter (SA-ADC) includes a digital-to-analog converter means (8;10) having two multiline inputs, of which one is connected to the multiline output of the voltage generator, a comparing means to compare the outputs of the sample-and-hold circuit and from the digital-to-analog converter and a shift register having a multiline digital output connected to the second multiline input of the digital-to-analog converter means and to the multiplexing means, the common reference voltage generator is divided into at least two parts (13,14), each part providing differently resoluted reference voltages, comprising coarse and fine reference voltages when two parts are provided; and wherein the digital-to-analog converting means in each computing channel includes a switch group (Sc,Sf) for each part of reference voltages, a summation circuit (11) to add the reference voltages from all the parts together, and a logic controller (12) to control the switches in the different parts;

f. a common reference voltage generator (2) is provided having a multiline output having a different reference voltage on each line of the multiline output; and g. all the computing channels having at least one multiline input connected in common to the multiline output of the voltage generator.

6. An arrangement according to claim 5, wherein the summation circuit (15) includes a first and a second capacitor (C1, C2), each having one electrode connected to a means (6') giving comparating results, the capacitance of the first capacitor (C1) being larger than the capacitance of the second capacitor (C2); and wherein a control means is provided controlling the other electrode of the first capacitor to be connected to the analog input during the auto-zero phase, to a coarse voltage switch group (Sc) during a coarse comparison phase and to the resulting coarse voltage (Vr) during a fine comparison phase; and wherein the control means controls the other end of the second capacitor to ground during the auto-zero phase and during the coarse comparison phase and to be connected to a fine switch group (Sf) during the fine comparison phase.

7. An arrangement according to claim 5, wherein the common reference voltage generator produces coarse reference voltages connected in common to all the channels; and wherein the digital-to-analog converting means in each computing channel includes a coarse switch group switching the coarse reference voltages, a fine switch group switching the fine reference voltages, a summation circuit to add the coarse and the fine reference voltages together and a logic controller to control the switches; and wherein the fine resistor string in each channel is buffered and copies the sampled analog input to the analog-to-digital converting means for fine resolution during a coarse comparison phase and the resulting coarse voltage range to generate fine reference voltages needed during a fine comparison phase.

8. An arrangement for converting a high-frequency analog input signal into a series of digital signals on-line with high sampling rate, including:

a. several computing channels (1.1 to 1.k+n;SA-ADC) for providing a digital signal from an analog input;

b. a multiplexing means (3) having several inputs, each input being connected to an individual computing channel output;

c. a timing circuit (4) controlling cyclically in a clock signal rate and in a prescribed order one at the time of the computing channels to receive the current analog value of the analog input signal and also to control the multiplexing means (3) to place on its output one at the time of the digital outputs of the several computing channels;

d. all the computing channels comprising means for computing the digital value of its received analog value during a digitizing phase simultaneously but skewed in relation to the other computing channels; wherein e. each of said several computing channels (1.1 to 1.k+n;SA-ADC) includes a sample-and-hold means (5), to which the analog input signal and at least one successive approximating analog-to-digital converter (SA-ADC) is connected, the sample-and-hold circuit in each computing channel includes a signal-controlled set buffer controlling a normally non-conducting switch transistor (Ss) to be conducting during a set signal from the timing circuit (4), a sampling capacitor (Cs) in series with the switch transistor, and the emitter-collector path of a dummy transistor (Sd) provided between the switch transistor and the sampling capacitor;

f. a common reference voltage generator (2) is provided having a multiline output having a different reference voltage on each line of the multiline output; and g. all the computing channels having at least one multiline input connected in common to the multiline output of the voltage generator.

* * * * *